US006803827B1

(12) United States Patent
Kenney et al.

(10) Patent No.: US 6,803,827 B1
(45) Date of Patent: Oct. 12, 2004

(54) FREQUENCY ACQUISITION SYSTEM (75) Inventors: John G. Kenney, Princeton Junction, NJ (US); Lawrence DeVito, Tewksbury, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/409,991

(22) Filed: Apr. 9, 2003

(51) Int. Cl.[7] .............................................. H03L 7/00
(52) U.S. Cl. ........................ 331/16; 331/11; 331/1 A; 331/17
(58) Field of Search ....................... 331/16, 17, 1 A, 331/8, 11; 327/106

(56) References Cited

U.S. PATENT DOCUMENTS

| | | | |
|---|---|---|---|
| 5,027,085 A | | 6/1991 | DeVito |
| 5,486,792 A | * | 1/1996 | Girardeau, Jr. .............. 331/10 |
| 5,495,205 A | * | 2/1996 | Parker et al. ............... 331/1 A |
| 5,739,725 A | * | 4/1998 | Ferraiolo et al. ............. 331/57 |
| 5,821,818 A | * | 10/1998 | Idei et al. ..................... 331/17 |
| 6,466,096 B1 | | 10/2002 | DeVito |

OTHER PUBLICATIONS

Behzad Razavi, *Challenges in the Design of High–Speed Clock and Data Recovery Circuits*, IEEE Communications Magazine 94 (Aug. 2002).

\* cited by examiner

*Primary Examiner*—Robert Pascal
*Assistant Examiner*—Joseph Chang
(74) *Attorney, Agent, or Firm*—Iandiorio & Teska (57) ABSTRACT

A frequency acquisition system for a tunable oscillator is provided that generally includes a frequency-locked loop circuit including a detector system, responsive to the frequency of an output signal of a tunable oscillator and the frequency of a reference signal, to provide a digital output signal representative of a difference in frequency between the output signal and the reference signal, a register circuit for storing a value representative of the present control state of the tunable oscillator; and an accumulator circuit responsive to a value representative of the present control state of the tunable oscillator and to the digital output signal for providing an updated value for adjusting the frequency of the tunable oscillator towards the frequency of the reference signal.

23 Claims, 8 Drawing Sheets

FREQUENCY DETECTOR
TIMING DIAGRAM

FREQUENCY ACQUISITION SYSTEM

FIELD OF THE INVENTION

This invention relates to a frequency acquisition system and, more specifically, a frequency acquisition system that uses a phase-locked loop and/or a frequency-locked loop.

BACKGROUND OF THE INVENTION

Prior art clock and data recovery (CDR) circuits may include a tunable oscillator, such as a voltage controlled oscillator (VCO), which is controlled both by a fine tune control signal produced by a phase-locked loop and a coarse tune control signal produced by a frequency-locked loop. Typically, the coarse tune control signal will set the center frequency of the VCO and the fine tune control signal will make smaller adjustments to drive the output signal towards the frequency of a reference or data signal.

The phase-locked loop (PLL) may fail to lock if the center frequency of the voltage controlled oscillator (VCO) is more than a few thousand parts-per-million (PPM) from the symbol rate of the incoming data. When the CDR is included on an IC and produced in mass quantity, a minimum variation of 10% can be expected in a VCO center frequency over process, temperature and supply. This wide range of frequencies may make it impossible for the PLL to lock under all situations without some type of frequency acquisition aid.

One technique known in the art for getting the frequency from the VCO to be in the range where the PLL can acquire lock is to frequency lock the VCO to a reference signal. At startup of the CDR, or when a loss of lock has been detected, the frequency-locked loop pulls the VCO to within a few hundred parts-per-million (PPM) of the reference frequency. A lock detector within the frequency-locked loop determines when frequency lock has been established and relinquishes control of the receiver timing to the phase-locked loop. The lock detector also determines when the frequency-locked loop leaves its locked state by comparing the frequency of the VCO to the frequency of the reference clock.

With one prior art frequency-locked loop, an analog charge pump is used to establish the correct voltage on the coarse tune port. There are two major drawbacks in using an analog charge pump: a charge pump typically requires a capacitor that may be on the order of $\mu F$ so it must be an off-chip component, and the capacitor is subject to leakage from numerous sources (e.g., ESD diodes, internal leakage of the capacitor).

When the lock detector disables the frequency-locked loop, the charge on the charge pump capacitor, which initially holds a charge representative of the present state of the coarse frequency tune signal, will change due to such effects as leakage current and circuit noise if no external compensation for lost charge is provided. An additional complication is that even if the charge on the charge pump capacitor does not change, the VCO output frequency can drift due to factors such as temperature or power supply variation.

An off-chip capacitor used with a CDR preferably has low leakage, otherwise the voltage from the fine tune signal can develop a large dc offset, which may alter the dynamics of the phase-locked loop. A large-valued capacitor with low leakage is physically big, and thus impacts the size of the printed circuit board on which it resides. A further complication in using a large off-chip component is that off chip connections may be subject to noise sources on the printed circuit board, which is disadvantageous because the coarse tune port of the VCO should be subject to as little noise as possible to minimize jitter generation.

Moreover, with the prior art CDR's, it may be necessary to use a transconductance amplifier to compensate for changes of charge on the frequency-locked loop charge pump capacitor due to the effects of leakage current and circuit noise such that the phase-locked loop can adequately compensate for variations in the center frequency due to these effects.

BRIEF SUMMARY OF THE INVENTION

It is therefore an object of this invention to provide an improved frequency acquisition system for a coarse and fine tunable oscillator.

It is a further object of this invention to provide such an improved frequency acquisition system that avoids the use of an off-chip capacitor to store the present state of a coarse control signal for the fine tunable oscillator.

It is a further object of this invention to provide such an improved frequency acquisition system that does not require leakage compensation for a capacitor in the frequency-locked loop.

It is a further object of this invention to provide such an improved frequency acquisition system that does not require the use of a transconductance amplifier to compensate for a capacitor leakage in a frequency-locked loop.

It is a further object of this invention to provide such an improved frequency acquisition system in which the time constant for the frequency-locked loop is accurately determinable.

The invention results from the realization that a more effective frequency acquisition system that reduces jitter generation by avoiding the use of a large frequency-locked loop capacitor can be obtained by using a digital accumulator circuit to digitally store and update the value of the present control state of a tunable oscillator to adjust the frequency of the tunable oscillator towards the frequency of a reference signal.

This invention features phase-locked loop system for a coarse and fine tunable oscillator comprising a phase detector responsive to the phase of an output signal of a tunable oscillator and the phase of a reference signal to provide an output signal representative of a difference in phase between the output signal and the reference signal; a loop filter, responsive to the output signal representative of the difference in phase, for providing a fine control signal to a fine control of the tunable oscillator to drive the frequency of the output signal of the tunable oscillator toward the frequency of the reference; and an accumulator circuit for digitally storing the present state of a coarse control signal of the tunable oscillator and responsive to the fine control signal for digitally updating the state of the coarse control of the tunable oscillator to drive the frequency of the output signal of the tunable oscillator towards the frequency of the reference signal.

In a preferred embodiment, the tunable oscillator may be a voltage controlled oscillator. The accumulator circuit may include an adder circuit having a first input coupled to an output of a register circuit, a second input responsive to the fine control signal, and an output coupled to an input of the register circuit. The accumulator circuit may include an analog to digital converter. The analog to digital converter may include a sigma-delta-modulator circuit. The register circuit may include a bit register. The loop filter may include a charge pump responsive to the output signal representative of a difference in phase, for providing an input to the accumulator circuit. The phase-locked loop system may include a frequency-locked loop that includes a frequency detector system responsive to the frequency of the output signal of the tunable oscillator and a frequency of a second reference signal to provide the coarse control signal. The frequency-locked loop may include a quantizer responsive to the coarse control signal, a digital to analog circuit having an input coupled to an output of the quantizer, and a low pass filter having an input coupled to the output of the digital to analog circuit and an output coupled to the tunable oscillator.

The invention also features a frequency acquisition system comprising a frequency detector system, responsive to the frequency of an output signal of a tunable oscillator and the frequency of a reference signal, to provide a digital output signal representative of a difference in frequency between the output signal and the reference signal; and an accumulator circuit responsive to a value representative of the present control state of the tunable oscillator and to the digital output signal for providing an updated value for adjusting the frequency of the tunable oscillator towards the frequency of the reference signal, the accumulator circuit including a digital register circuit for storing the value representative of the present control state of the tunable oscillator.

In a preferred embodiment of the frequency acquisition system, the accumulator circuit may include an adder circuit responsive to the digital output signal and the value stored in the register circuit. The frequency acquisition system may include a drift compensation loop circuit including a phase detector responsive to the phase of the output signal of the tunable oscillator and the phase of a second reference signal to provide a second output signal representative of a difference in phase between the output signal and the reference signal; and a loop filter, responsive to the second output signal representative of the difference in phase, for providing a fine control signal to a fine control of the tunable oscillator to drive the frequency of the output signal of the tunable oscillator toward the frequency of the reference signal. The loop filter may include a charge pump responsive to the output signal representative of the difference in phase, the charge pump providing an input to the accumulator circuit. The tunable oscillator may include a voltage controlled oscillator. The accumulator circuit may include an analog to digital converter. The analog to digital converter may include a sigma-delta-modulator circuit. The frequency acquisition system may include a quantizer responsive to the coarse control signal, a digital to analog circuit having an input coupled to an output of the quantizer, and a low pass filter having an input coupled to the output of the digital to analog circuit and an output coupled to the tunable oscillator.

The invention also features a frequency acquisition system for a tunable oscillator including a frequency-locked loop circuit including a detector system, responsive to the frequency of an output signal of a tunable oscillator and the frequency of a first reference signal, to provide a digital output signal representative of a difference in frequency between the output signal and the first reference signal; a drift compensation loop circuit including a phase detector responsive to the phase of the output signal of the tunable oscillator and the phase of a second reference signal to provide a second output signal representative of a difference in phase between the output signal and the second reference signal; a loop filter, responsive to the second output signal representative of the difference in phase, for providing a fine control signal to a fine control of the tunable oscillator to drive the frequency of the output signal of the tunable oscillator toward the frequency of the second reference signal; and an accumulator circuit for digitally storing the present state of either the fine control signal or the digital output and for providing a coarse control signal to a coarse control of the tunable oscillator to update the tunable oscillator to drive the frequency of the output signal of the tunable oscillator towards the frequency of the second reference signal.

Preferably, in this embodiment of the frequency acquisition system, the accumulator circuit may include an adder circuit responsive to the value stored in the register circuit and either the digital output signal or the second output signal. The tunable oscillator may include a voltage controlled oscillator. The accumulator circuit may include an analog to digital converter. The analog to digital converter may include a sigma-delta-modulator circuit. The first reference signal may include a clock signal and the second reference signal may include a data signal.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings.

Figure 1:
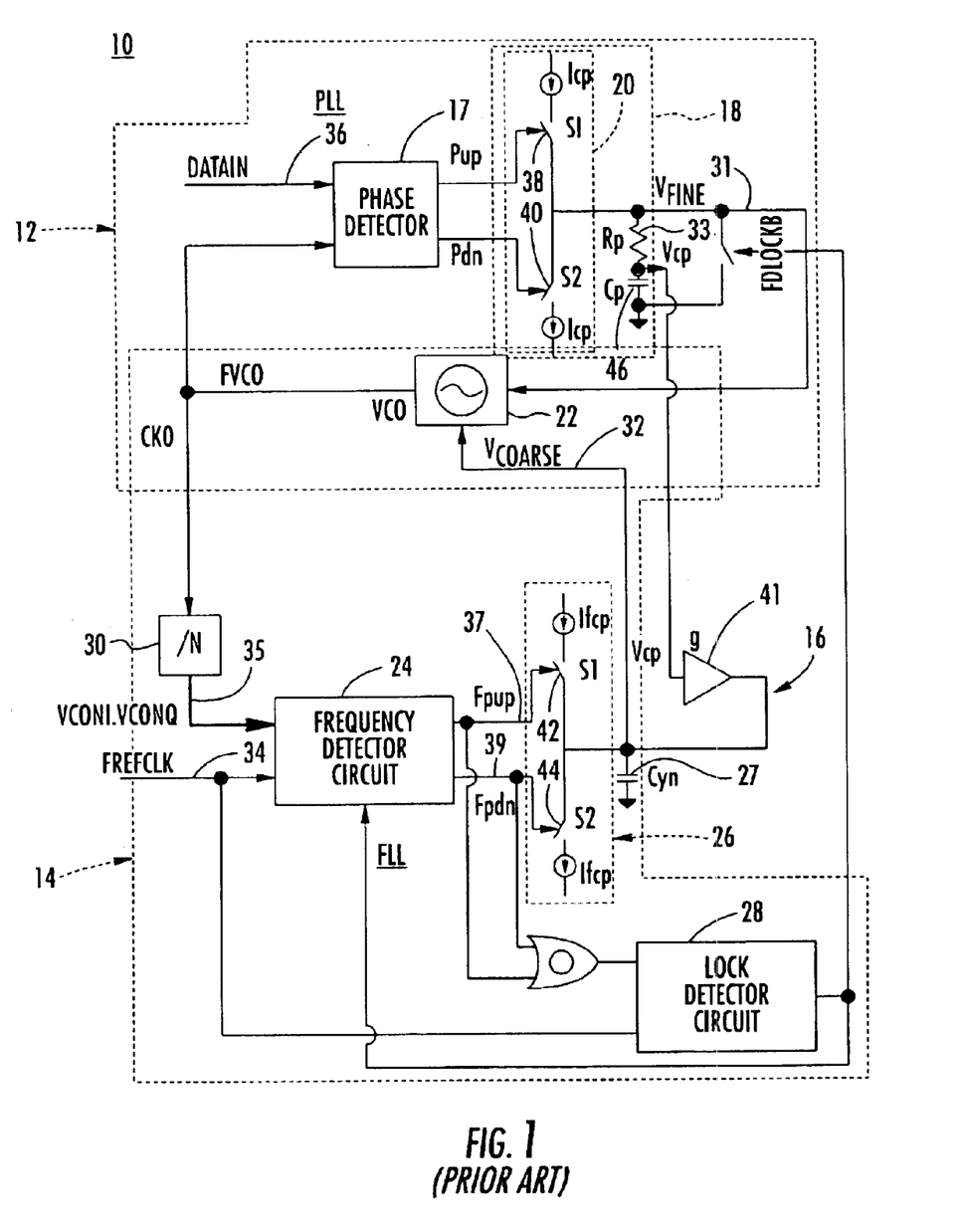
FIG. 1 is a schematic view of a prior art clock and data recovery circuit that includes a frequency-locked loop and a phase-locked loop having a frequency charge pump.

A prior art clock and data recovery circuit (CDR) 10, FIG. 1, includes a phase-locked loop (PLL) 12, a frequency-locked loop (FLL) 14, and a leakage/drift compensation loop 16. Phase-locked loop 12 includes a phase detector 17, a loop filter 18 having a charge pump 20 and a voltage controlled oscillator (VCO) 22. Frequency-locked loop 14 includes a frequency detector circuit 24, a charge pump 26, a capacitance Cyn 27, a lock detector circuit 28, VCO 22 and a frequency divider circuit 30. Leakage/drift compensation loop 16 includes phase detector 17, loop filter 18, transconductance amplifier 41, and VCO 22.

FLL 14 attempts to set the frequency of VCO 22 to be in a range in which PLL 12 can lock the frequency of VCO 22 to data. Frequency detector 24 compares reference clock FREFCLK on line 34 with the signal on line 35, which is the output of VCO 22 divided by the frequency divider circuit 30; FREFCLK on line 34 may be derived from a crystal clock.

When lock detector 28 determines that FLL 14 is out of lock, and frequency detector 24 determines that the divided VCO frequency FVCO/N on line 35 is less than reference clock FREFCLK on line 34, signal fpup on line 37 is asserted logic HIGH thereby closing switch 42 for a fixed time. A charge equal to $I_{fcp}$ multiplied by the time duration for which switch 42 is closed is placed on Cyn 27. Similarly, when frequency detector 24 ascertains that divided VCO frequency FVCO/N on line 35 is greater than frequency clock FREFCLK, signal fpdn on line 39 is asserted logic HIGH, thereby closing switch 44; this action pulls a fixed amount of charge from Cyn 27. As noted above, however, there are major drawbacks in using an analog charge pump for the frequency-locked loop 14: Cyn 27 is typically large and must be an off-chip component, and the capacitor Cyn is subject to leakage from numerous sources.

When lock detector 28 has determined that frequency-locked loop 14 is in lock, leakage/drift compensation loop 16 is used to drive the dc voltage on capacitor Cp of the phase charge pump 20 to zero such that PLL 12 can stay within a desirable voltage range. Leakage/drift compensation loop 16 uses transconductance amplifier 41 to dump charge into Cyn.

Figure 2:
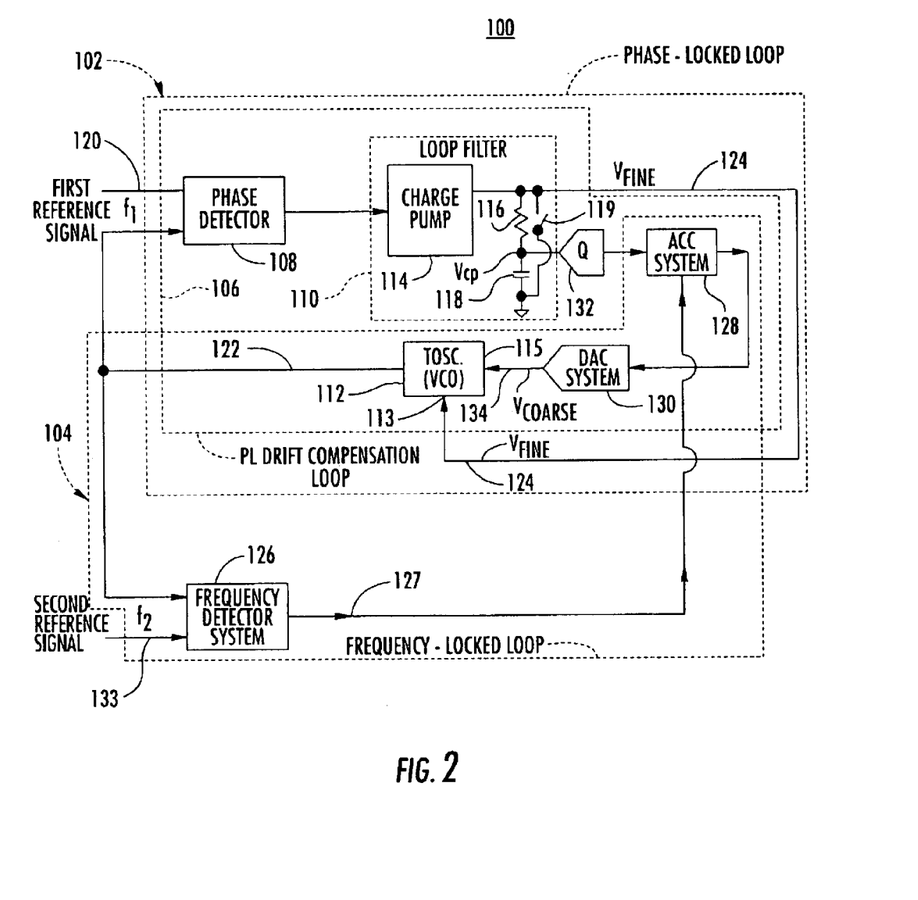
FIG. 2 is a schematic block diagram of a clock and data recovery circuit in accordance with the present invention.

In accordance with the present invention, CDR 100, FIG. 2, includes a phase-locked loop 102, a frequency-locked loop 104 and a phase-locked drift compensation loop 106. Phase-locked loop 102 includes phase detector 108, a loop filter 110, and a tunable oscillator 112, such as a voltage controlled oscillator (VCO). Tunable oscillator 22 includes two inputs 113 and 115 corresponding to $V_{fine}$ and $V_{coarse}$ inputs, respectively. Loop filter 110 may include a charge pump 114, a resistance 116, and a capacitor 118. Phase detector 108 is responsive to a first reference signal, $f_1$, on line 120 and a signal on line 122 coupled to an output of tunable oscillator 112. First reference signal $f_1$ may be, for example, a data signal such as a binary data signal. Phase detector 108 has an output coupled to an input of loop filter 110, which has an output 124 coupled to an input 113 of tunable oscillator 112.

Frequency-locked loop 104 includes a frequency detector system 126, an accumulator system 128, a digital to analog converter (DAC) system 130, and a tunable oscillator 112. Frequency detector system 126 is responsive to the output on line 122 of tunable oscillator 112, and also a second reference signal $f_2$ on line 133. Second reference signal $f_2$ on line 133 can be, for example, a clock, which can be produced by, for example, a crystal clock. Alternatively, the second reference signal $f_2$ can be the same as the first reference signal $f_1$. An output of frequency detector system 126 is coupled to an input of digital accumulator system 128, which has an output coupled to an input of digital to analog of (DAC) system 130. An output of DAC system 130 is coupled to input 115 of tunable oscillator 112.

Drift compensation loop 106 includes phase detector 108, loop filter 110, a quantizer 132, digital accumulator system 128, DAC system 130, and tunable oscillator 112. A quantizer 132 is coupled to an output of loop filter 110. For example, a quantizer may be coupled between resistor 116 and capacitor 118. An output of quantizer 132 is coupled to an input of digital accumulator system 128.

In operation, frequency detector system 126, FIG. 2, compares the signal on line 122, which is the output of tunable oscillator 112, with reference signal $f_2$ on line 133. Frequency detector system 126 outputs a signal on line 127 to accumulator system 128. The signal on line 127 indicates to digital accumulator system 128 whether to increase or decrease the voltage of the $V_{coarse}$ signal 134. Digital accumulator system 128, which stores a present value of the $V_{coarse}$ signal, adjusts the present value of $V_{coarse}$ in response to the signal on line 127. An output of digital accumulator system 128 is coupled to an input of DAC system 130, which converts the digital signal of digital accumulator system 128 to an analog signal. The output of DAC system 130 is the $V_{coarse}$ signal on line 134, which is coupled to input 115 of tunable oscillator 112. When frequency detector system 126 determines that the tunable oscillator output signal on line 122 is within a predetermined frequency range to reference signal $f_2$ on line 133, phase-locked loop 102 assumes control of the frequency acquisition of CDR 100.

Phase detector 108 compares the output 122 of tunable oscillator 112 with first reference signal $f_1$ on line 120. The output of phase detector 108 is input into charge pump 114 of loop filter 110. Charge pump 114 outputs on line 124 either a positive or negative charge depending on whether the signal on line 122 was leading or lagging the phase of first reference signal $f_1$ on line 120. Signal $V_{fine}$ on line 124, which is coupled to input 113 of tunable oscillator 112, makes small adjustments in the frequency of the output signal of tunable oscillator 122.

Preferably, the bandwidth of drift compensation loop 106 is significantly lower than the bandwidth of phase-locked loop 102. Also, the bandwidth of phase-locked loop 102 is significantly lower than that of the frequency locked-loop 106, e.g., by a factor of ten.

CDR 100 uses drift compensation loop 106 to keep the voltage of loop filter capacitor 118 at zero such that phase-locked loop 102 remains at the middle of its voltage range, and thus can continue to effectively adjust the frequency of the signal on line 122 at the output of tunable oscillator 112. Switch 119 across line 124 is closed to reset voltage on this node to 0V and to set the fine tune control in the middle of its range. The signal $V_{cp}$ is input into quantizer 132 to digitize the voltage of $V_{cp}$. The output of quantizer 132 is input into digital accumulator system 128, which determines what adjustments to make to the $V_{coarse}$ signal on line 134 such that the $V_{fine}$ signal on line 124 remains within the middle of its voltage range.

Figure 3:
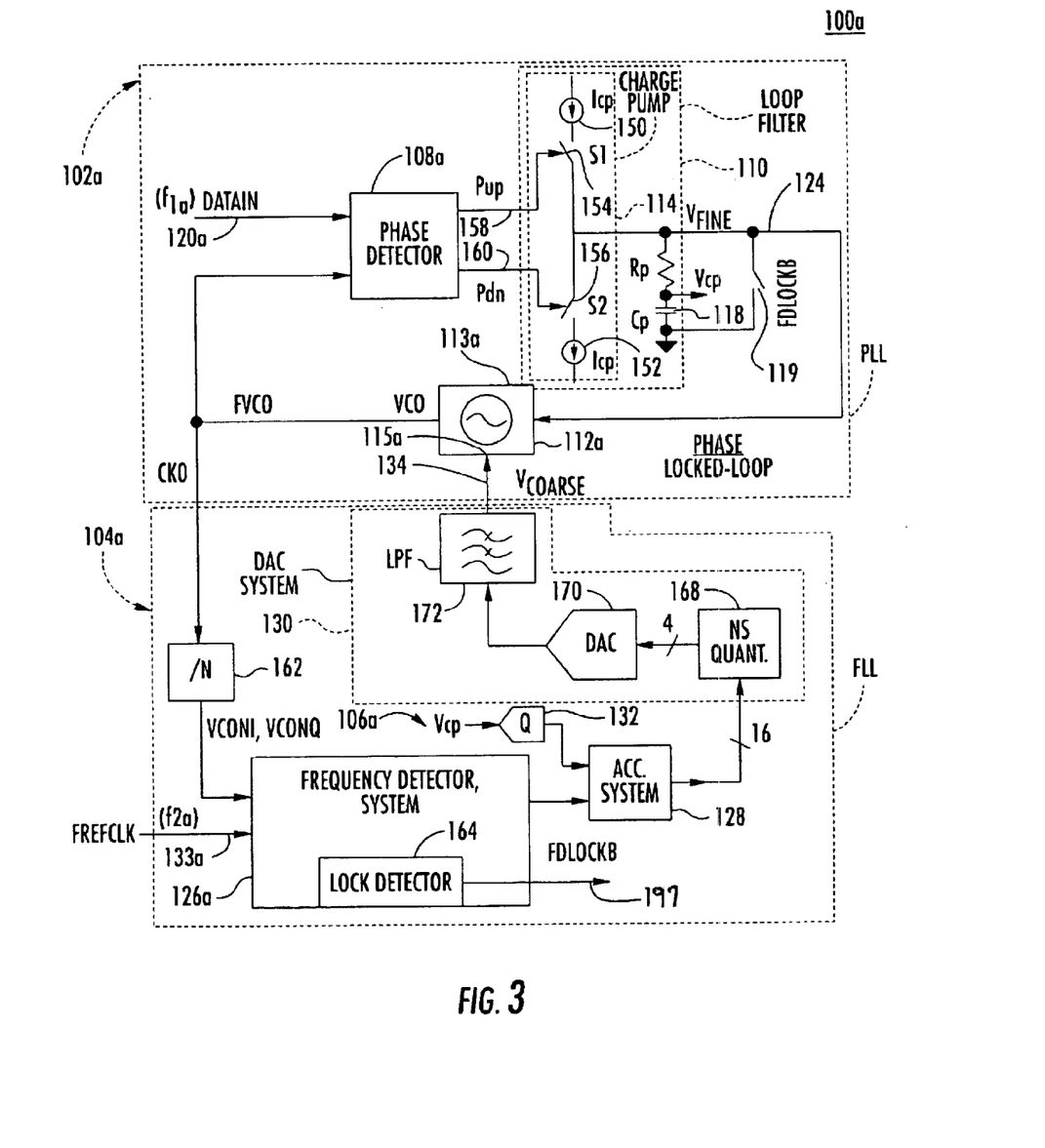
FIG. 3 is a more detailed schematic block diagram of a preferred embodiment of the clock and data recovery circuit of FIG. 2 according to this invention.

In a more specific embodiment, as shown in FIG. 3, where like parts have been given like numbers accompanied by a lower-case "a", CDR 100a includes a phase-locked loop 102a, a frequency-locked loop 104a, and a phase-locked drift compensation loop 106a. In the phase-locked loop 102a, charge pump 114 can include two current sources 150 and 152, and two switches 154 and 156, which are responsive to a pulse-up signal on line 158 or a pulse-up signal on line 160 from phase detector 108a. Reference signal $f_{1_a}$ on line 120a may be, for example, a data signal. The tunable oscillator may be, for example, a voltage controlled oscillator (VCO) 112a.

In frequency-locked loop 104a, the output of VCO 112a can be input into a divide-by-N circuit 162 for dividing the output frequency of the VCO. An output of divide-by-N circuit 162 is coupled to an input of frequency detector system 126a. Reference signal $f_{2_a}$ on line 133a, which is input to frequency detector system 126a, can include, for example, a frequency reference clock. Frequency detector system 126a can include a lock detector 164 for determining when frequency-locked loop 104a has adequately locked to reference clock $f_{2_a}$ on line 133a and that frequency control should be turned over to PLL 102a. DAC system 130 can include a noise shaping quantizer 168, a digital to analog converter (DAC) 170, and a low pass filter (LPF) 172. An output of digital accumulator system 128 is coupled to an input of noise shaping quantizer 168. An output of noise shaping quantizer 168 is coupled to an input of DAC 170, which has an output coupled to an input of LPF 172. An output of LPF 172 is input to $V_{coarse}$ input 115a of VCO 112a.

Once frequency-locked loop 104a has established lock, signal FDLOCKB on line 197 from lock detector 164 is a logic low and drift compensation loop 106a is activated to maintain the voltage on the phase-locked loop charge capacitor 118a in the middle of its swing range. When signal FDLOCKB on line 197 is a logic high, switch 119 across line 124 is closed to reset the voltage on line 124 to 0V. When signal FDLOCKB is a logic low, CDR 100a passes control from frequency-locked loop 104a to phase-locked loop 102a, and switch 119 on line signal 124 is opened. In a single phase-locked loop with an RC loop filter, such as that shown in FIG. 3, drift compensation loop 106a will keep the voltage on charge pump capacitor 118 substantially equal to a voltage that is at the center of the fine-tuned port swing range of VCO 112a. This result is preferable since the fine tune gain can vary by a factor of two over the swing range of signal $V_{fine}$ on line 124.

Figure 4:
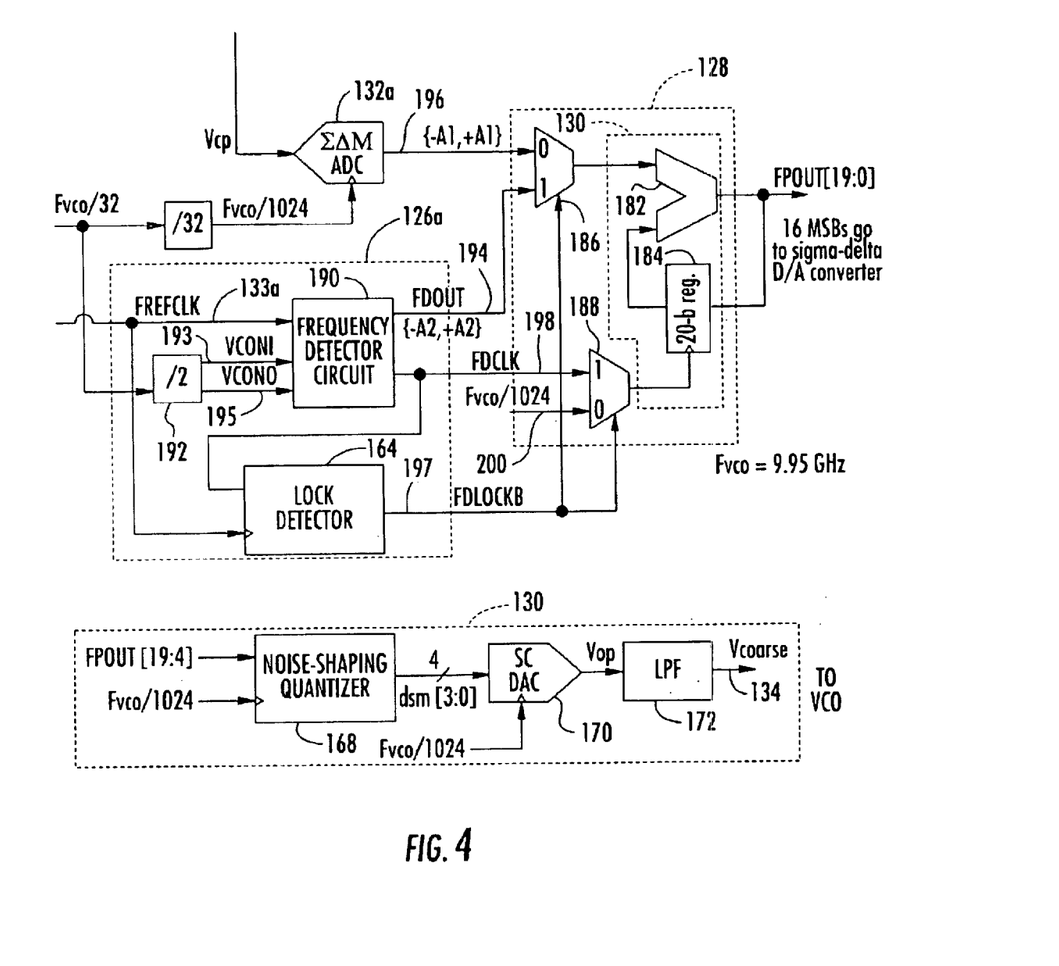
FIG. 4 is a schematic view of the frequency acquisition system of FIG. 3 in greater detail.

Quantizer 132a, FIG. 4, may be a sigma delta modulator (SDM) analog to digital converter, although other architectures (e.g., pipeline or flash) could be used. Digital accumulator system 128 may include an accumulator circuit 180 that includes an adder 182 and a bit register 184, such as a twenty bit register. Digital accumulator system 128 also includes two multiplexers 186 and 188. Multiplexer 186 has one input coupled to an output of SDM 132a, a second input coupled to an output of frequency detector circuit 190, and an output coupled to an input of adder 182. An output of adder 182 is coupled to the input of bit register 184, which has an output coupled to a second input of adder 182.

Frequency detector system 126a may include a frequency detector circuit 190 and lock detector 164. A divide-by-two circuit 192 can be used to obtain divided-down versions of the VCO output. Signal VCONQ, a square wave, is shifted by ¼ of its period to make the VCONQ and VCONI signals 90° out of phase. Divided-down versions of the VCO output are input to frequency detector circuit 190 to be compared with frequency reference clock $f_{2_a}$ on line 132a. An output of frequency detector circuit 190 is coupled to a second input of multiplexer 186. Multiplexer 186 is controlled by control signal FDLOCKB on line 197 from lock detector 164, which determines whether to use the signal on line 194, representative of an increase or decrease of the $V_{coarse}$ signal, or the signal on line 196, representative of an increase or decrease of the $V_{fine}$ signal. Signal FDLOCKB on line 197 is used to control multiplexer 188, which determines which clock should be used to clock bit register 184. Clock signal on line 200 is a divided-down version of the VCO output, while clock signal on line 198 is a non-periodic signal dependent on the difference between signal $f_2$ on line 133a and the signals on lines 193 and 195. A sub-harmonic of frequency reference clock $f_{2_a}$ on line 133a may also be used to clock SDM ADC 132a and other digital portions of drift compensation loop 106a, such as DAC 170.

A logic one from SDM ADC 132a causes a binary number, which can be notated as A1, to be added to the present state of accumulator 180, whereas a logic zero from the SDM ADC causes A1 to be subtracted from the present state of accumulator 180. Bit register 184 stores the value of the present state of accumulator 180. Likewise, output 194 of frequency detector circuit 190 causes accumulator 180 to be increased or decreased by a binary value, which can be notated as A2, when multiplexer 186 selects signal FDOUT on line 194 to appear at the output of multiplexer 186. Generally, the value of A1 is smaller than A2, as it will produce a fast clock acquisition. In the case in which A1 is a binary one, accumulator 180 will function as a $B_1$-bit up/down counter.

Figure 5A:
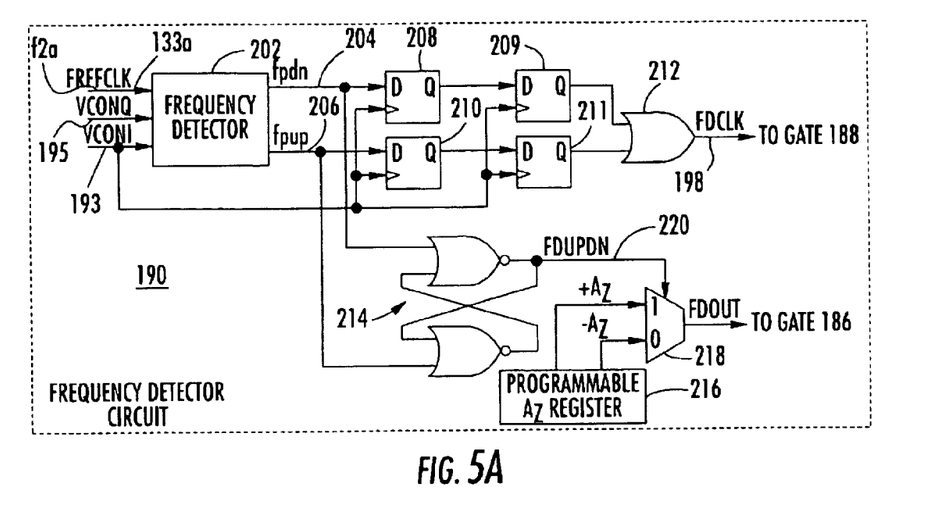
FIG. 5A is a schematic view of the frequency detector system of FIG. 3 in greater detail.

Frequency detector circuit 190, FIG. 5A, may include frequency detector 202 that has two output terminals 204 and 206 that correspond to frequency pulse-down and frequency pulse-up signals, respectively. Signals on terminals 204 and 206 are each separately coupled to four consecutive DQ flip-flops 208–211 to create a delay of two clock periods. The outputs of DQ flip-flops 209 and 211 are both input to OR gate 212, which provides clock signal FDCLK on line 198 that is input to multiplexer 188.

R-S flip-flop 214 has two inputs coupled to pulse-up and pulse-down signals 204 and 206, and determines whether the last activity out of frequency detector 202 was a pulse-up or a pulse-down. The signal on line 220, which is the output of R-S flip-flop 214, is asserted logic high if pulse-up signal 206 was most recently high. Line 220 is asserted logic low if pulse-down signal 204 was most recently low, as shown at 221, FIG. 5B.

A programmable register 216, FIG. 5A, is a register for storing the binary value of A2 and may be included in frequency detector circuit 190 to program the binary value of +A2 or −A2. Alternatively, the binary values of +A2 and −A2 may be predetermined. Multiplexer 218 is controlled by signal FDUPDN on line 220 of R-S flip-flop 214, and is responsive to the two outputs of programmable register 216.

Frequency detector 202, FIG. 5A, is used to compare the difference between frequency reference clock $f_{2_a}$ on line 133a and signals VCONI on line 193 and VCONQ on line 195, which are quadrature clocks running at a divided-down version of the output of VCO 112a, FIG. 3. Frequency detector 202, FIG. 5A, generates frequency pulse-up or frequency pulse-down signals on lines 206 and 204, respectively. The updates of these pulses occur at non-periodic rates, which forces frequency detector 202 to supply a clock signal on line 198 to multiplexer 188. The frequency of pulses from the signal on line 198 is related to the difference in frequency between frequency reference clock signal $f_2$ on line 133a and the divided-down version of the output of VCO 112a. The frequency of pulses on line 198 occurs more rapidly for large frequency differences (i.e., when the frequency loop 104a, FIG. 3, is severely out of lock) than for small frequency differences.

Figure 5B:
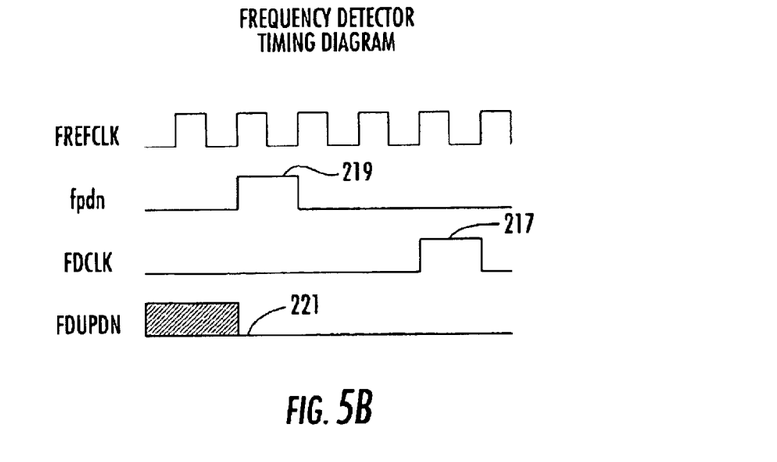
FIG. 5B is a liming diagram of the signals shown in the frequency detector circuit of FIG. 5A.

Frequency pulse-down signal fpdn on line 204, FIG. 5A, similar to frequency pulse-up signal, fpup, is asserted as logic high at 219, FIG. 5B, for one clock period of frequency reference clock f₂a on line 133a. Signal FDCLK on line 198 is a logic high at 217, two clock periods after either signal fpdn or fpdn is asserted logic high. R-S flip-flop 214, FIG. 5A, remembers whether signal fpdn or fpup was last asserted as logic high, and outputs a signal FDUPDN on line 220. Signal FDUPDN is asserted as logic low if fpdn was most recently a logic high as shown as 221, FIG. 5B. Signal FDUPDN is asserted as logic high if fpup was most recently a logic high.

Figure 6:
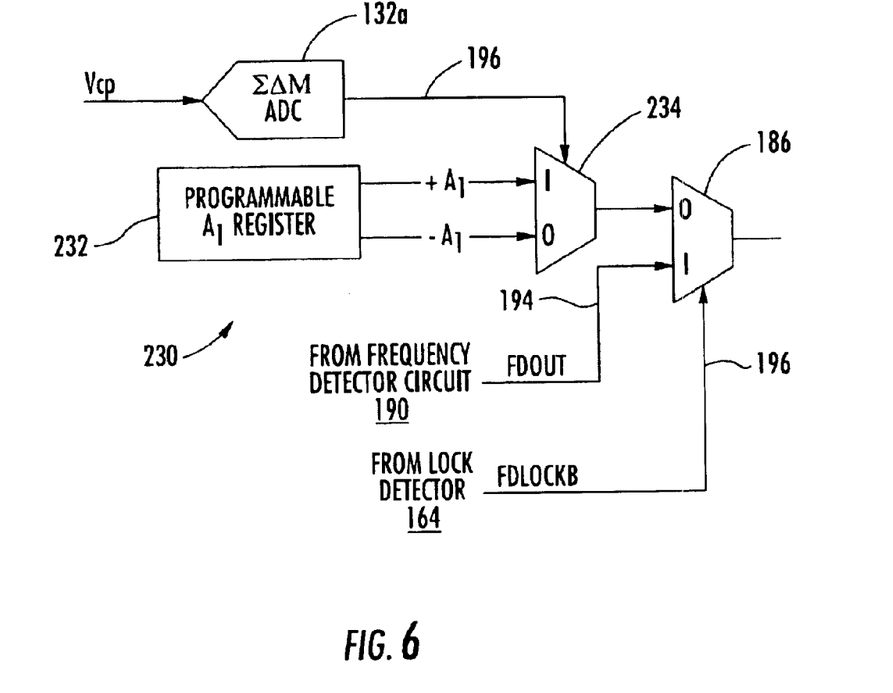
FIG. 6 is a schematic view of a programmable register circuit that can be used to program the drift compensation loop of FIG. 2.

A programmable register 232, FIG. 6, may also be used with the circuit of FIG. 4 to program the values of −A1 and +A1. The outputs of programmable A1 register 232 are input to gate 234, which is controlled by the output signal on line 196 of SDM ADC 132a. As in FIG. 4, the values of −A1 or +A1 are input to multiplexer 186, which has an output that is input to the adder 182 of accumulator 180.

Figure 7:
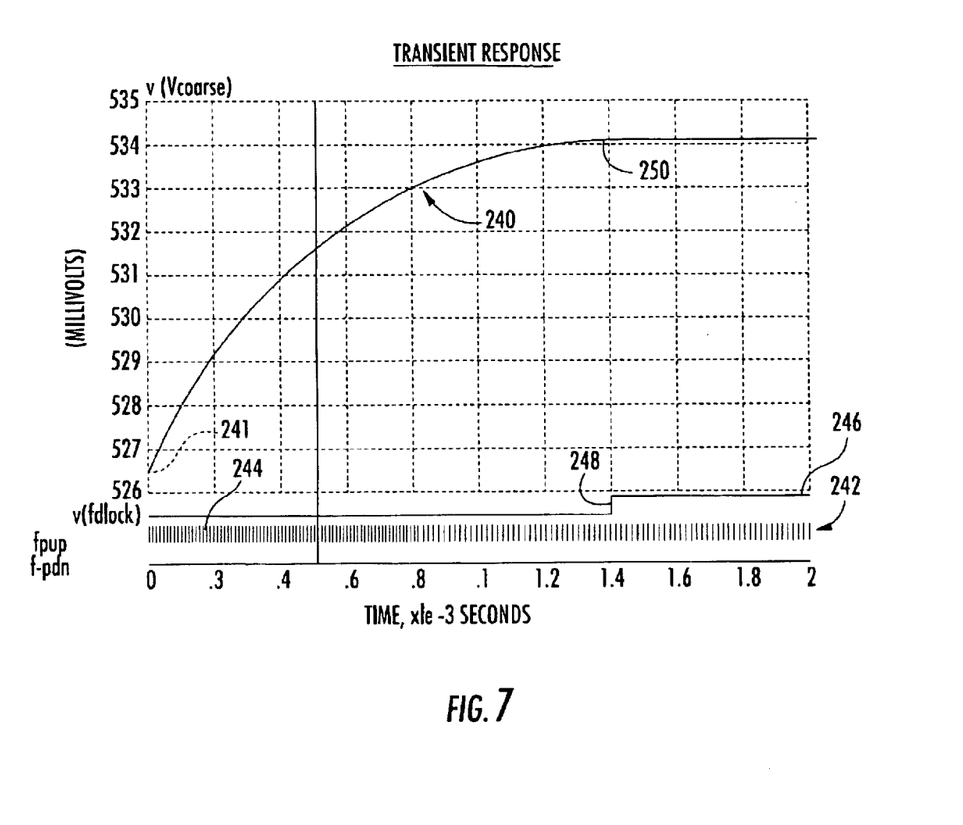
FIG. 7 is a graph of voltage vs. time showing the transient response of the $V_{coarse}$ control signal.

Transient response 240, FIG. 7, is shown for the signal $V_{coarse}$ on line 134, FIG. 2, vs. time. At time zero 241, FIG. 7, when frequency-locked loop 104 is greatly out of lock, the frequency of clock signals 242 is increased on line 198, FIG. 5A, as shown at 244. The output on line 196 of lock detector 164, FIG. 4, is shown at 246. At time zero 241, the frequency lock output is at a logic zero because frequency-locked loop 104 is out of lock. At 248, lock detector output on line 196 is asserted as logic high to designate that frequency-locked loop 104 is in lock, as shown at 250 of $V_{coarse}$ transient response 240. One of the advantages of the present invention is that the time constant of the transient response of CDR 100, FIG. 2, can be accurately calculated. For the simulation, the time constant was predicted to be 528 s. versus 507 s. in the simulation in FIG. 7.

Figure 8A:
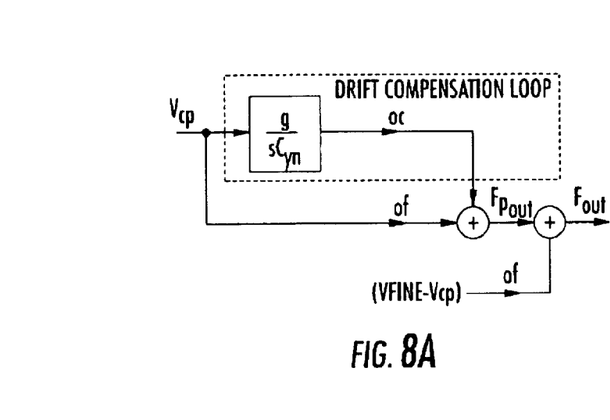
FIG. 8A is a schematic view of an alternative theoretical embodiment of a continuous-time drift compensation loop of the clock and data recovery circuit of FIG. 2.
Figure 8B:
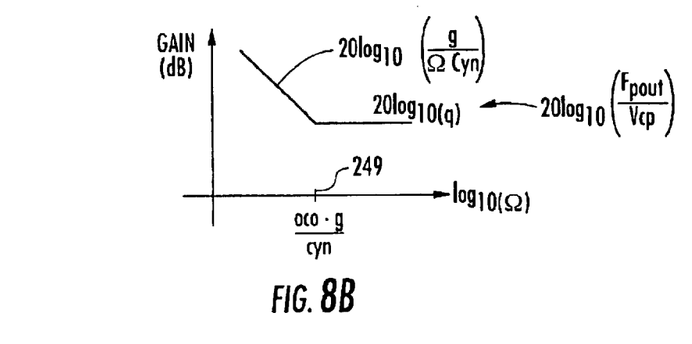
FIG. 8B is a graphical view of the open loop gain from $V_{cp}$ to FPout in bode plot form for the embodiment of FIG. 8A.

A continuous time analysis for drift compensation loop 106b is shown in FIGS. 8A and 8B. The vertical axis on graph 250, FIG. 8B, is Gain in dB and the horizontal axis is log 10(frequency); this is a log-log plot. A zero 249 is placed at a frequency (oco·g)/(2 Cyn) Hz, where oco is the ratio of the coarse tune gain oc to the fine tune gain of. At frequencies below zero 249, the gain of drift compensation loop 106a sets the dynamics of the loop. For frequencies beyond zero 249, the of path dominates the response. Oco is optimized in the design to place zero 249 where desired.

Figure 8C:
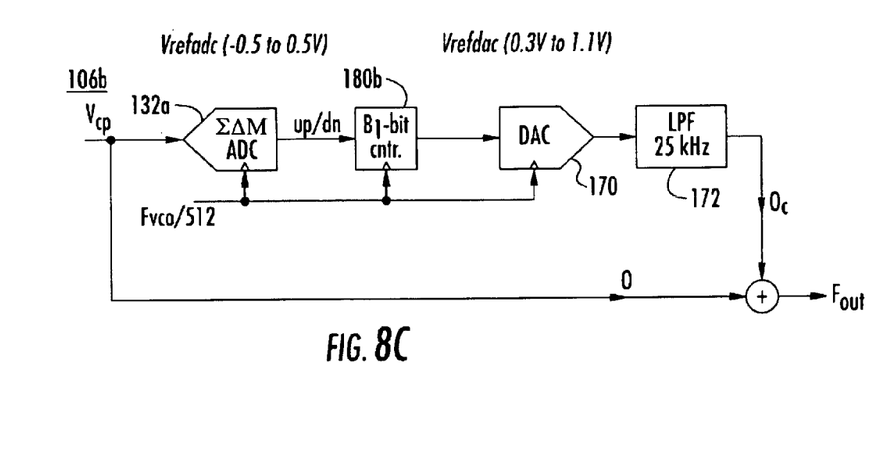
FIG. 8C is a schematic view of a continuous-time drift compensation loop of FIG. 8A.

Circuit 251, FIG. 8C, which is an embodiment of the architecture using the analysis of FIG. 8A, is heavily oversampled, which makes approximating the Fourier transform for the $B_1$ counter 252 and mapping it to the continuous integrator of FIG. 8A relatively straightforward. The z-transform for the up/down counter 252 is $H(z)=2^{-(B_1-1)}/(1-z^{-1})$. Its discrete-time Fourier transformation is $H(f)=2^{(B_1-1)}/(1-e^{(-j2\pi f/Fs)})$. Drift compensation loop 106a is preferably designed so that the zero shown in FIG. 8B is at a much lower frequency than FVCO/512.

In the case of a mixed-signal drift compensation loop 106b, FIG. 8C, in which A1 is one, accumulator 180b functions as a $B_1$-bit up/down counter 252. The corner frequency of low pass filter 172 is preferably significantly higher than the desired zero location such that low pass filter 172 does not affect the dynamic behavior of drift compensation loop 106a. Preferably, the number of bits in digital accumulator 180, FIG. 4, is 20 bits to achieve a long time constant. Drift compensation deals with variations in the center frequency of VCO 112a which occur after the original frequency acquisition by frequency-locked loop 104a. Factors which may cause the center frequency of VCO 112a to change include temperature or power supply variations. Drift compensation loop 106a drives the voltage on the charge pump capacitor $V_{cp}$ to 0.

After the initial acquisition, phase charge pump 114 quickly adjusts the voltage on $V_{cp}$ 118 so the output frequency of the VCO moves towards the frequency of the input data. After the initial transient, drift compensation loop 106a monitors changes in the VCO output frequency FVCO by measuring the voltage on charge pump capacitor $V_{cp}$ 118. Feedback for drift compensation loop 106a tracks low frequency changes in $V_{cp}$ with the purpose of driving the voltage on charge pump capacitor 118 to 0. This feedback is a factor at frequencies below the zero whose continuous-time analog is (oco·g)/(2 cyn) Hz.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A phase-locked loop system for a coarse and fine tunable oscillator comprising:
   a phase detector responsive to the phase of an output signal of a tunable oscillator and the phase of a reference signal to provide an output signal representative of a difference in phase between said output signal and the reference signal;
   a loop filter, responsive to said output signal representative of the difference in phase, for providing a fine control signal to a fine control of the tunable oscillator to drive the frequency of the output signal of the tunable oscillator toward the frequency of said reference voltage; and
   an accumulator circuit for digitally storing the present state of a coarse control signal of the tunable oscillator and responsive to said fine control signal for digitally updating the state of the coarse control of the tunable oscillator to drive the frequency of the output signal of the tunable oscillator towards the frequency of the reference signal.

2. The phase-locked loop system of claim 1 in which the tunable oscillator includes a voltage controlled oscillator.

3. The phase-locked loop system of claim 1 in which the accumulator circuit includes an adder circuit having a first input coupled to an output of a register circuit, a second input responsive to said fine control signal, and an output coupled to an input of the register circuit.

4. The phase-locked loop system of claim 3 in which the accumulator circuit further includes an analog to digital converter.

5. The accumulator circuit of claim 4 in which the analog to digital converter includes a sigma-delta-modulator circuit.

6. The accumulator circuit of claim 3 in which the register circuit includes a bit register.

7. The phase-locked loop system of claim 1 in which said loop filter includes a charge pump responsive to the output signal representative of the difference in phase, for providing an input to the accumulator circuit, and a reset switch for resetting the fine control signal.

8. The phase-locked loop system of claim 1 further including a frequency-locked loop that includes a frequency detector system responsive to the frequency of the output signal of the tunable oscillator and the frequency of a second reference signal to provide the coarse control signal.

9. The phase-locked loop system of claim 8 in which the frequency-locked loop further includes a quantizer responsive to the coarse control signal, a digital to analog circuit having an input coupled to an output of the quantizer, and a low pass filter having an input coupled to the output of the digital to analog circuit and an output coupled to the tunable oscillator.

10. A frequency acquisition system for a tunable oscillator comprising:

a detector responsive to the frequency of an output signal of a tunable oscillator and the frequency of a reference signal, to provide a digital output signal representative of a difference in frequency between said output signal and the reference signal; and a digital accumulator circuit responsive to a value representative of the present control state of the tunable oscillator and to said digital output signal for providing an updated value for adjusting the frequency of the tunable oscillator towards the frequency of said reference signal, the accumulator circuit including a digital register circuit for storing the value representative of the present control state of the tunable oscillator.

11. The frequency acquisition system of claim 10 in which the accumulator circuit includes an adder circuit responsive to said digital output signal and the value stored in said register circuit.

12. The frequency acquisition system of claim 10, further including:

a drift compensation loop circuit including a phase detector responsive to the phase of the output signal of the tunable oscillator and the phase of a second reference signal to provide a second output signal representative of a difference in phase between said output signal and the reference signal; and a loop filter, responsive to said second output signal representative of the difference in phase, for providing a fine control signal to a fine control of the tunable oscillator to drive the frequency of the output signal of the tunable oscillator toward the frequency of said reference signal.

13. The frequency acquisition system of claim 12 in which the loop filter includes a charge pump responsive to the output signal representative of the difference in phase, said charge pump providing an input to the accumulator circuit, and a reset switch for resetting the fine control signal.

14. The frequency acquisition system of claim 10 in which the tunable oscillator includes a voltage controlled oscillator.

15. The frequency acquisition system of claim 10 in which the accumulator circuit further includes an analog to digital converter.

16. The frequency acquisition system of claim 15 in which the analog to digital converter includes a sigma-delta-modulator circuit.

17. The frequency acquisition system of claim 16 further including a quantizer responsive to the coarse control signal, a digital to analog circuit having an input coupled to an output of the quantizer, and a low pass filter having an input coupled to the output of the digital to analog circuit and an output coupled to the tunable oscillator.

18. A frequency acquisition system for a tunable oscillator comprising:

a frequency-locked loop circuit including a frequency detector responsive to the frequency of an output signal of a tunable oscillator and the frequency of a first reference signal, to provide a digital output signal representative of a difference in frequency between said output signal and the first reference signal;

a drift compensation loop circuit including a phase detector responsive to the phase of the output signal of the tunable oscillator and the phase of a second reference signal to provide a second output signal representative of a difference in phase between said output signal and the second reference signal;

a loop filter, responsive to said second output signal representative of the difference in phase, for providing a fine control signal to a fine control of the tunable oscillator to drive the frequency of the output signal of the tunable oscillator toward the frequency of said second reference signal; and an accumulator circuit for digitally storing the present state of either the fine control signal or the digital output and for providing a coarse control signal to a coarse control of the tunable oscillator to update the tunable oscillator to drive the frequency of the output signal of the tunable oscillator towards the frequency of the second reference signal.

19. The frequency acquisition system of claim 18 in which the accumulator circuit includes an adder circuit responsive to the value stored in said register circuit and either said digital output signal or said second output signal.

20. The frequency acquisition system of claim 18 in which the tunable oscillator includes a voltage controlled oscillator.

21. The frequency acquisition system of claim 18 in which the accumulator circuit further includes an analog to digital converter.

22. The frequency acquisition system of claim 21 in which the analog to digital converter includes a sigma-delta-modulator circuit.

23. The frequency acquisition system of claim 18 in which the first reference signal includes a clock signal and the second reference signal includes a data signal.

* * * * *